United States Patent [19]

Kawakyu et al.

[11] Patent Number: 4,594,528
[45] Date of Patent: Jun. 10, 1986

[54] THIN FILM ELECTROLUMINESCENCE DEVICE AND METHOD OF MANUFACTURING THE SAME

[75] Inventors: Yoshito Kawakyu, Kawasaki; Toyoki Higuchi, Yokohama; Hiroshi Ito, Tokyo, all of Japan

[73] Assignee: Tokyo Shibaura Denki Kabushiki Kaisha, Kawasaki, Japan

[21] Appl. No.: 532,977

[22] Filed: Sep. 16, 1983

[30] Foreign Application Priority Data

Sep. 27, 1982 [JP] Japan .................. 57-166567
Mar. 25, 1983 [JP] Japan .................. 58-49905

[51] Int. Cl.⁴ .............................................. B05D 3/06
[52] U.S. Cl. .................................... 313/503; 313/509; 427/39; 427/64; 427/66; 427/86
[58] Field of Search ................ 423/325; 252/301.4 F; 427/39, 86, 64, 66; 313/499, 498, 383, 503, 509

[56] References Cited

U.S. PATENT DOCUMENTS

| | | | |
|---|---|---|---|
| 2,809,316 | 10/1957 | Jeges | 313/503 |
| 3,009,834 | 11/1961 | Hanlet | 313/503 |
| 3,986,193 | 10/1976 | Vodakov et al. | 319/499 |
| 4,289,822 | 9/1981 | Shimada et al. | 427/93 |
| 4,464,415 | 8/1984 | Yamazaki | 427/39 |
| 4,478,654 | 10/1984 | Gau et al. | 427/86 |
| 4,492,810 | 1/1985 | Ovshinsky et al. | 427/39 |

FOREIGN PATENT DOCUMENTS

| | | |
|---|---|---|
| 0058543 | 8/1982 | European Pat. Off. |
| 109522 | 11/1974 | Fed. Rep. of Germany |
| 1435466 | 5/1976 | United Kingdom |
| 2094550 | 9/1982 | United Kingdom |
| 2094289 | 9/1982 | United Kingdom |

*Primary Examiner*—John H. Newsome
*Attorney, Agent, or Firm*—Oblon, Fisher, Spivak, McClelland & Maier

[57] ABSTRACT

A thin film electroluminescence device which comprises a pair of electrodes, at least one of which is transparent, and a light-emitting layer consisting essentially of oxygen-containing amorphous hydrogenated silicon carbide and being interposed between said paired electrodes.

9 Claims, 6 Drawing Figures

THIN FILM ELECTROLUMINESCENCE DEVICE AND METHOD OF MANUFACTURING THE SAME

BACKGROUND OF THE INVENTION

This invention relates to a thin film electroluminescence device generating electroluminescence upon application of an electric field.

This thin film electroluminescence device emits light of intense brightness and its light-emitting layer has low granularity. Consequently, it is anticipated that this electroluminescence device will be particularly advantageous when applied to a data communication terminal in the form of an image display device, replacing the conventional cathode ray tube.

The thin film electroluminescence device developed to date is the type whose light-emitting layer is prepared from ZnS mixed with Mn, Cu, or the like, to produce a monochromatic light such as a green or yellow light. However, no thin film electroluminescence device has been obtained which can emit white light.

In recent years, an electroluminescence device capable of emitting white light of high brightness has been proposed, whose light-emitting layer is prepared from ZnS:PrF$_3$. The white light obtained by this device, however, has resulted from a combination of complementary colors. Therefore, said device fails to attain the color display function characterizing a white light-emitting electroluminescence device.

Another known thin film electroluminescence device is of the type whose light-emitting layer consists of a thin film of hydrogenated amorphous silicon carbide obtained by the glow-discharge decomposition of a gas consisting mainly of tetramethylsilane (TMS). Recently, attention has been focused on this electroluminescence device, whose emission spectrum covers the whole range of a visible light spectrum, and which can emit white light allowing for color display. At present, however, the brightness of the white light derived from said electroluminescence device is too low for practical purposes.

SUMMARY OF THE INVENTION

Since this invention has been contrived in view of the above, it is intended to provide a thin film electroluminescence device capable of emitting white light of high brightness.

To attain the above-mentioned object, this invention provides a thin film electroluminescence device which comprises a pair of electrodes, at least one of which is rendered transparent, and a light emitting layer consisting essentially of oxygen-containing hydrogenated amorphous silicon carbide and interposed between said paired electrodes.

Ideally, the ratio Si/C between the number of atoms of silicon (Si) and carbon (C) composing the above-mentioned hydrogenated amorphous silicon carbide employed in the electroluminescence device of the present invention should satisfy the following inequality:

$$0.2 \leq Si/C \leq 5.0$$

The reason for this requirement is that, when the ratio Si/C falls below 0.2, the luminuous intensity of the electroluminescence device sees an overall decrease; whereas, when said ratio Si/C rises above 5.0, the electroluminescence device fails to emit white light.

Further, the ratio O/(Si+C+O) between the number of oxygen atoms and the sum of the number of atoms of silicon, carbon and oxygen should satisfy the following inequality:

$$0.05 \leq O/(Si+C+O)$$

or, more preferably, the below-mentioned inequality:

$$0.30 \leq O/(Si+C+O) \leq 0.55$$

Most preferably, the above-mentioned ratio O/(Si+C+O) should satisfy the following inequality:

$$0.35 \leq O/(Si+C+O) \leq 0.5$$

This invention allows for a thin film electroluminescence device emitting a white light of high brightness, which device can be manufactured at low cost.

DETAILED DESCRIPTION OF THE PREFERRED EMBODIMENT

Figure 1:
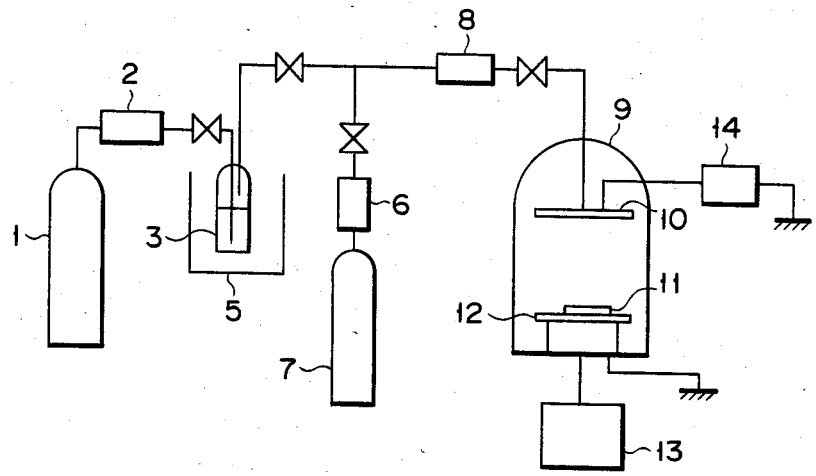
FIG. 1 schematically illustrates the film-fabricating system used in the manufacture of the thin film electroluminescence device embodying this invention.

Hydrogenated amorphous silicon carbide films were prepared via the system of FIG. 1, and the properties of those films were measured.

EXPERIMENT 1

An He gas used as a carrier gas was held in a gas cylinder 1. Said He gas was made to bubble through a container 3 holding tetramethylsilane Si(CH$_3$)$_4$. At this time, the flow rate of the He gas was set at 50 standard cm$^3$/min, by a flow meter 2. The container 3 was maintained at $-20°$ C. in a constant temperature bath 5. The carrier gas need not be limited to He, but may instead consist of another inert gas, such as Ar or N$_2$. The inert gas may be replaced by H$_2$. Drawn off from the container 3 were a carrier gas and a vapor of tetramethylsilane, at the flow rate of 7.5 standard cm$^3$/min, corresponding to the vapor pressure of tetramethyl silane at $-20°$ C. An O$_2$ gas set at a flow rate of 3 standard cm$^3$/min by a flow meter 6 was mixed with the carrier gas containing tetramethylsilane. The gas mixture was taken into a chamber 9. In this case, the flow rate of the total mixture of the carrier gas, tetramethylsilane vapor and $O_2$ gas was monitored at 60.5 standard cm$^3$/min, by a flow meter 8.

Thereafter, the exhaust system 13 was so adjusted as to cause the gas pressure in the chamber 9 to be maintained at a level of from 0.1 to 5 Torr, e.g., at a level of 1.0 Torr. An upper electrode plate 10 included in the period parallel electrode plates 10, 12 was supplied with rf power of 13.56 MHz, from an electric power source 14, at a power density level of from 0.1 to 2.5 W/cm$^2$, e.g., at a power density level of 0.25 W/cm$^2$, thereby producing a glow discharge in a space defined between said upper electrode plate 10 and grounded lower electrode plate 12. A glass substrate 11 whose surface was coated with a transparent conductive film was mounted on said lower electrode plate 12. The gas mixture introduced into the chamber 9 was decomposed by the glow discharge, causing a layer of oxygen-containing hydrogenated amorphous silicon carbide to be deposited on the transparent conductive film. In this case, the lower electrode 12 was heated, and the glass substrate was set at a temperature of 200° C.

With an oxygen-containing hydrogenated amorphous silicon carbide film A, the numbers of the oxygen atoms contained therein indicated the following ratio:

$$O/(Si+C+O)=0.22$$

Figure 2:
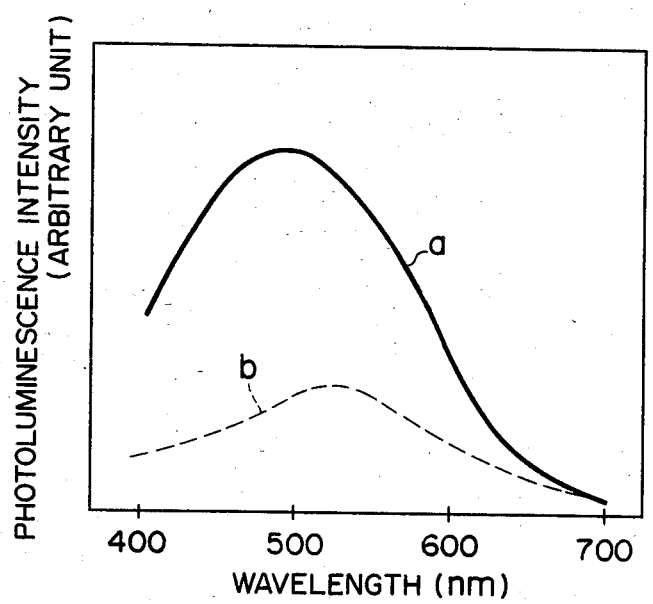
FIG. 2 graphically shows the photoluminescence spectrum of an amorphous hydrogenated silicon carbide film obtained by the system of FIG. 1.

Curve a of FIG. 2 shows the spectrum of photoluminescence obtained by irradiating light rays onto film A, from a mercury lamp (254 nm). Curve b of FIG. 2 denotes the spectrum of photoluminescence obtained from an oxygen-free hydrogenated amorphous silicon carbide film B (Si/C=0.25) fabricated by introducing an oxygen-free feed gas into the chamber 9. The comparison of curve a to curve b (shown in FIG. 2) indicates that an oxygen-containing hydrogenated amorphous silicon carbide film increases in photoluminescence efficiency.

Figure 3:
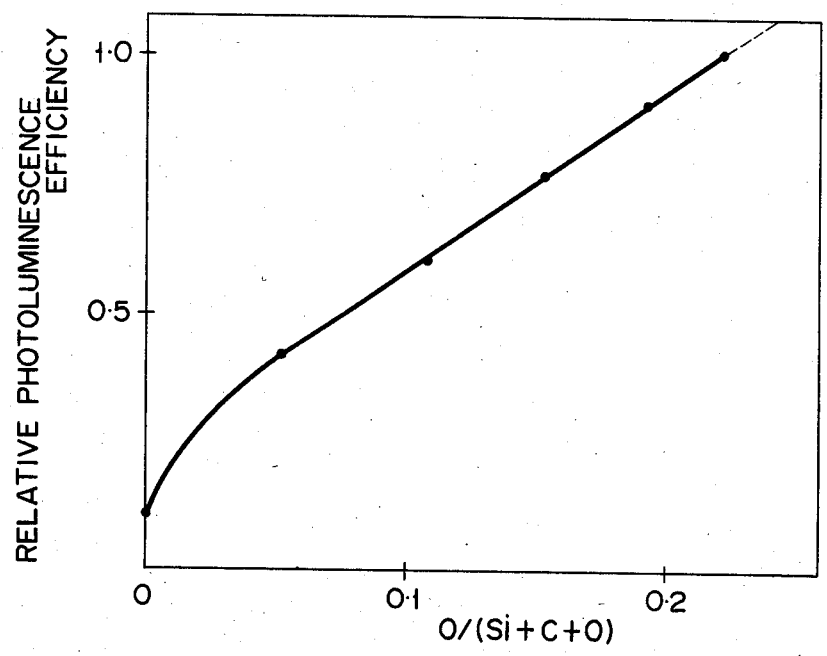
FIG. 3 graphically shows the photoluminescence efficiency of a hydrogenated amorphous silicon carbide film whose oxygen content is varied.

In the foregoing experiment, film B was deposited at the rate of 55 Å/min, whereas film A was deposited at the rate of 120 Å/min. This fact proves that the application of an oxygen-containing feed gas is preferable, in the formation of a film, from the standpoint of productivity. FIG. 3 graphically shows the photoluminescence efficiency of oxygen-containing hydrogenated amorphous silicon carbide films which were fabricated by varying the flow rate of an oxygen gas to change the oxygen content. The graph of FIG. 3 shows that the photoluminescence efficiency of a hydrogenated amorphous silicon carbide film was progressively elevated as a larger amount of oxygen was contained in the film, and that oxygen should preferably be added in such an amount as would satisfy the below-mentioned ratio formula:

$$O/(Si+C+O) \geq 0.05$$

EXPERIMENT 2

Figure 4:
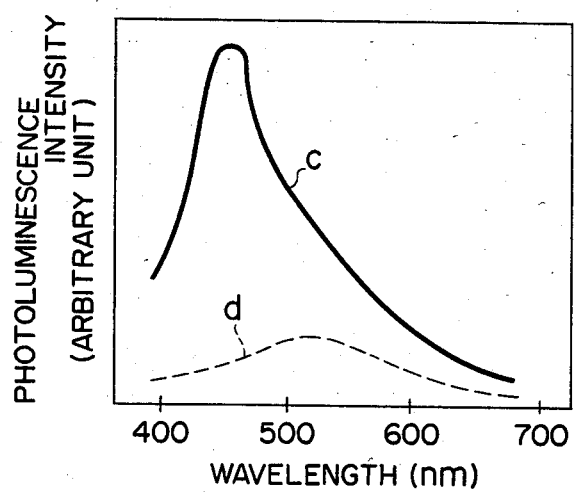
FIG. 4 graphically sets forth the photoluminescence spectrum of another amorphous hydrogenated silicon carbide film obtained by the system of FIG. 1.

A hydrogenated amorphous silicon carbide film C was fabricated substantially in the same manner as in Experiment 1, except that an rf power of 1 W/cm$^2$ was applied and a ratio $O/(Si+C+O)$ of 0.45 was chosen. Curve c of FIG. 4 shows the spectrum of the photoluminescence of said film C. Curve d of FIG. 4 indicates the spectrum of the photoluminescence of an oxygen-free hydrogenated amorphous silicon carbide film D. FIG. 4 shows that an oxygen-containing hydrogenated amorphous silicon carbide film is noticeably elevated in photoluminescence efficiency.

Figure 5:
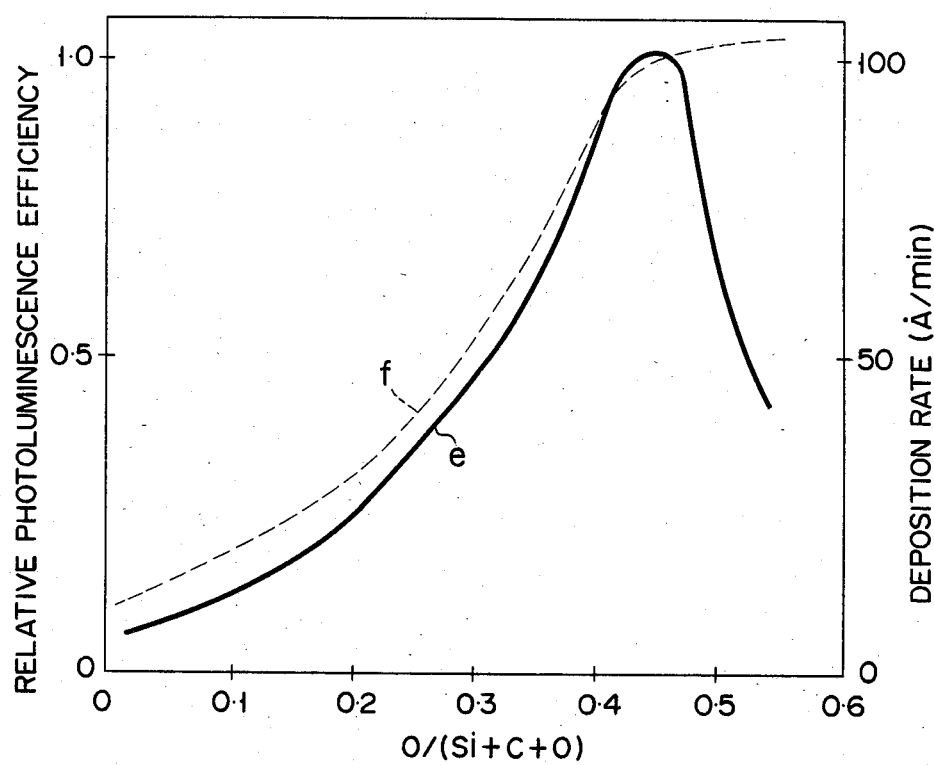
FIG. 5 graphically shows the photoluminescence efficiency obtained when an oscillation line of 254 nm (from a mercury lamp) is used as an exciting source, and the deposition rate of a hydrogenated amorphous silicon carbide film whose oxygen content is varied.

FIG. 5 graphically shows the photoluminescence efficiency (curve e) of an oxygen-containing hydrogenated amorphous silicon carbide film fabricated by varying the flow rate of an oxygen gas to change the oxygen content, as well as the rate (curve f) at which said film was deposited. FIG. 5 indicates that a hydrogenated amorphous silicon carbide film progressively increases in photoluminescence efficiency, as a larger amount of oxygen is contained in the film, whereas the addition of oxygen beyond a certain extent conversely leads to a decline in the photoluminescence efficiency; oxygen should preferably be added in such an amount as to satisfy the ratio of $0.3 \leq O/(Si+C+O) \leq 0.55$ or, particularly, the ratio of $0.35 \leq O/(Si+C+O) \leq 0.5$; the film being deposited at a faster rate, as its oxygen content increases.

The foregoing experiments 1, 2 refer to the case wherein measurement was made of the intensity of the photoluminescence of the subject film, to facilitate the experiments. Obviously, this invention offers the same result described above, even when the film is caused to emit electroluminescence, by applying an AC electric field.

The present invention may be better understood with reference to the following concrete example.

EXAMPLE

Figure 6:
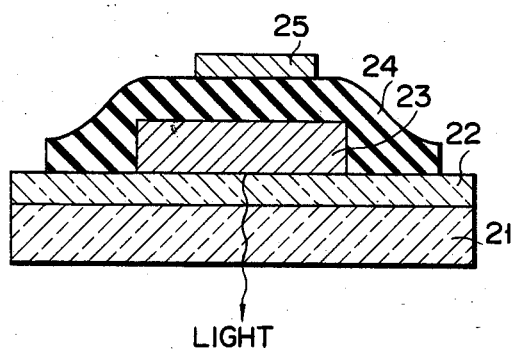
FIG. 6 is a cross sectional view of the thin film electroluminescence device embodying this invention.

FIG. 6 is a cross sectional view of a thin film electroluminescence device embodying this invention. This device was manufactured in the following manner. First, a transparent conductive film, e.g., an ITO film 22, was deposited on the surface of a glass substrate 21 by sputtering or electron beam evaporation. Next, an oxygen-containing hydrogenated amorphous silicon carbide film 23 was deposited to a thickness of 0.1 microns on said transparent conductive film 22, under the same conditions as those under which film A was formed. Later, to increase the breakdown voltage of the device, a ferroelectric material consisting of a $Y_2O_3$ film 24 was deposited on said SiC film 23, with a thickness of from about 0.1 to 0.2 microns, by electron beam evaporation. Further, an aluminium electrode 25 was thermally deposited on said ferroelectric material of $Y_2O_3$ film 24, thereby completing the subject thin film electroluminescence device. The light emission threshold voltage $V_{th}$ of a thin film electroluminescence device, thus produced, indicated 50 V. This voltage level is extremely low, being about half the light emission threshold voltage $V_{th}$ of the device using an oxygen-free hydrogenated amorphous silicon carbide film as a light-emitting layer. The oxygen containing hydrogenated amorphous silicon carbide film device displayed a level of brightness about 10 times as high as that of an oxygen-free hydrogenated amorphous silicon carbide film device. Further, light emission resulting from electroluminescence was spread over the entire range of visible light, as in the case of the photoluminescence of FIGS. 2 and 4.

With the embodiment of FIG. 6, an insulating film 24 is interposed between the light-emitting layer 23 and electrode 25. However, this invention is not limited to such a type, since it is also possible to deposit an insulating film between the light-emitting layer 23 and transparent conductive film 22. Further, it is possible to let the light-emitting layer 23 be directly deposited on the transparent conductive film 22 and electrode 25, without depositing an insulating film on the top and bottom planes of the light-emitting layer 23. The previously described ITO (transparent conductive film 22) may be replaced by SnO$_2$, and Al may be substituted by Mo.

Referring to Experiments 1 and 2 and the Example, ratio O/(Si+C+O) may be varied by adjusting the flow meter 6 to change the flow rate of oxygen, by controlling the flow rate of a carrier gas by the flow meter 2, or by changing the temperature of the thermobath 5.

Further, it is possible to replace the tetramethyl silane used as a feed gas with triethylsilane or a mixture of silane+methane, silane+ethane, or silane+propane.

The glow discharge-producing electrode arrangement used in the system of FIG. 1 was of the capacitive coupling type, which was constructed by allowing a pair of electrodes to face each other vertically. However, the application of an electrode arrangement of the inductive coupling type can also allow for the manufacture of an oxygen-containing hydrogenated amorphous silicon carbide film.

What is claimed is:

1. An electroluminescence device which comprises a pair of electrodes, at least one of which is transparent, and a light-emitting layer consisting essentially of oxygen-containing amorphous hydrogenated silicon carbide and being interposed between the paired electrodes, wherein the ratio O/(Si+C+O) of the amorphous hydrogenated silicon carbide is so determined as to satisfy the formula:

$$0.05 \leq O/(Si+C+O).$$

2. The electroluminescence device according to claim 1, wherein the ratio O/(Si+C+O) is so determined as to satisfy the following formula:

$$0.3 \leq O/(Si+C+O) \leq 0.55$$

3. The electroluminescence device according to claim 2, wherein ratio O/(Si+C+O) is so determined as to satisfy the following formula:

$$0.35 \leq O/(Si+C+O) \leq 0.5$$

4. An electroluminescence device which comprises:
a glass substrate;
a transparent electrode deposited on said glass substrate;
a light emitting layer consisting essentially of an oxygen-containing amorphous hydrogenated silicon carbide; and
a metal electrode deposited on said light-emitting layer.

5. The electroluminescence device according to claim 4, wherein an insulating film is interposed between the transparent electrode and light-emitting layer and/or between said light-emitting layer and metal electrode.

6. A method of manufacturing a thin film electroluminescence device, which comprises the step of depositing a light-emitting layer by decomposing a feed gas containing silicon, carbon, hydrogen and oxygen, by means of glow discharge, thereby producing a light-emitting layer which consists essentially of oxygen-containing amorphous hydrogenated silicon carbide, and wherein the ratio O/(Si+C+O) of the amorphous hydrogenated silicon carbide is so determined as to satisfy the formula:

$$0.05 \leq O/(Si+C+O).$$

7. The method according to claim 6, wherein said feed gas mainly consists of a gas containing silicon, carbon and hydrogen, as well an oxygen gas.

8. The method according to claim 6, wherein the gas containing silicon, carbon and hydrogen is one selected from the group consisting of: tetramethylsilane, triethylsilane and a gaseous mixture of silane and methane, a gaseous mixture of silane and ethane, and a gaseous mixture of silane and propane.

9. The method of claim 6, wherein the ratio O/Si+C+O) is so determined as to satisfy the formula:

$$0.3 \leq O/(Si+C+O) \leq 0.55.$$

* * * * *